US006969854B1

United States Patent
Essers et al.

(10) Patent No.: US 6,969,854 B1
(45) Date of Patent: Nov. 29, 2005

(54) ARRANGEMENT FOR HOLDING A PARTICLE BEAM APPARATUS

(75) Inventors: Erik Essers, Aalen (DE); Michael Trunz, Ellwangen (DE)

(73) Assignee: Carl Zeiss NTS GmbH, Oberkochen (DE)

( * ) Notice: Subject to any disclaimer, the term of this patent is extended or adjusted under 35 U.S.C. 154(b) by 128 days.

(21) Appl. No.: 10/614,614

(22) Filed: Jul. 7, 2003

(51) Int. Cl.[7] .................... G01B 27/58; G01M 23/00
(52) U.S. Cl. .............. 250/311; 250/306; 250/309; 248/638
(58) Field of Search ................ 250/311, 306, 250/309; 248/638, 637, 649, 653, 655, 661, 662, 672, 677, 678

(56) References Cited

U.S. PATENT DOCUMENTS 4,044,256 A * 8/1977 Krisch et al. ............... 250/311
6,646,719 B2 * 11/2003 Lee et al. ..................... 355/72

OTHER PUBLICATIONS

Erik Essers, Gerd Benner, Alexander Orchowski, Roland Kappel and Michael Trunz, Distributed on CD "Microsoft and Microanalysis 2002 (8) Suppl. 2, 2002, 484" at the Conference "Microscopy and Microanalysis 2002," Aug. 5–8, 2002, in Quebec, Canada.
Erik Essers, Gerd Benner, Alexander Orchowski, Roland Kappel and Michael Trunz, Poster from Conference "Microscopy and Microanalysis 2002," Aug. 5–8, 2002, in Quebec, Canada.
A Suspension System for a Very High Resolution Electron Microscope, by A.E. Timbs and P.W. Turner, Engineering Department at Cambridge University in England.
Electronic, Mechanical and Electron–Optical Engineering Design Features of the Cambridge University 600 kV High Resolution Electron Microscope by W.C. Nixon, H. Ahmed, C.J.D. Catto, J.R.A. Cleaver, K.C.A. Smith, A.E. Timbs and P.W. Turner, Engineering Department at Cambridge University in England.

* cited by examiner

*Primary Examiner*—John R. Lee
*Assistant Examiner*—James J. Leybourne
(74) *Attorney, Agent, or Firm*—Choate, Hall & Stewart

(57) ABSTRACT

An arrangement for holding a particle beam apparatus such as a transmission electron microscope. The arrangement is sufficient for receiving a good resolution in the area of 1 Å or less, said arrangement still being under more or less no influence of the environment, in particular, building vibrations. In one embodiment, the arrangement comprises a base structure comprising a plurality of hollow bodies, at least one of said hollow bodies having a first length extension in a first direction, a second length extension in a second direction and a third length extension in a third direction, said first length extension being larger than said second and third length extensions, and wherein a cross section of said at least one of said hollow bodies perpendicular to said first direction is substantially triangular. Due to the hollow body shape, a very stiff structure is provided with a very good eigenfrequency.

47 Claims, 5 Drawing Sheets

ARRANGEMENT FOR HOLDING A PARTICLE BEAM APPARATUS

BACKGROUND OF THE INVENTION

1. Technical Field

This application relates to the field of holding arrangements and more particularly to the field of arrangements for holding a particle beam apparatus, in particular a transmission electron microscope.

2. Description of Related Art

A particle beam apparatus, in particular a transmission electron microscope, is well known in the art. A particle beam apparatus comprises several components, such as a particle source for providing particles for a particle beam, several lenses for forming the particle beam, a specimen holder for holding a specimen to be examined and detection means for detecting particles which arise from the interaction of the particle beam's particles and the specimen, e.g. a camera for recording an image. These components are generally arranged in a column of the particle beam apparatus.

Transmission electron microscopes are also well known in the art. A transmission electron microscope (hereinafter referred to as TEM) substantially comprises the components mentioned-above, whereby the particle source is an electron source and an electron optical setup is provided in the column (electron optical column). For many applications it is required that the TEM has a high resolution. A resolution of 1 Å or less is required for many important applications. However, ultimate stable operating conditions of the electron optical setup are required, otherwise it is difficult to reach a good resolution. Accordingly, the TEM environment must be stable, thereby preventing alterations in the optical conditions of the TEM. In particular, any AC-stray fields, mechanical instabilities caused by building vibrations, acoustic noises and temperature changes have to be avoided or at least to be kept to a minimum. In particular, the electron optical column has to be of high robustness regarding environmental influences.

From "ELECTRONIC, MECHANICAL AND ELECTRON-OPTICAL ENGINEERING DESIGN FEATURES OF THE CAMBRIDGE UNIVERSITY 600 kV RESOLUTION MICROSCOPE" by Nixon et. al, Ninth International Congress on Electron Microscopy, Toronto 1978, VOL I, and "A SUSPENSION SYSTEM FOR A VERY HIGH RESOLUTION ELECTRON MICROSCOPE" by Timbs et. al., Ninth International Congress on Electron Microscopy, Toronto 1978, VOL I, a suspension system is known which supports a complete electron optical column somewhat above its centre of gravity by three wall mounted units, which contain compressed air cylinders with rolling rubber diaphragms. However, this wall mounted suspension system has several practical disadvantages: It requires a serious structural engineering measure and can not be displaced. Furthermore, it leads to a much more extensive mounting of the TEM at the costumers place and offer only poor possibilities for purposes of system integration such as mounting of cables, tubes and peripheral devices.

SUMMARY OF THE INVENTION

According to the present invention, an arrangement for holding a particle beam apparatus, in particular a transmission electron microscope, comprises a base structure comprising a plurality of hollow bodies. At least one of said hollow bodies has a first length extension in a first direction, a second length extension in a second direction and a third length extension in a third direction, said length extension in said first direction being larger than said length extensions in said second and third directions. Moreover, a cross section of said at least one of said hollow bodies perpendicular to said first direction is substantially triangular.

Due to the hollow body shape of one embodiment of the invention, a very stiff structure is provided with a very good (i.e. high) natural frequency (eigenfrequency). Thus, an embodiment of the invention is very insensitive with respect to mechanical excitations, especially building vibrations, when holding a particle beam apparatus. Furthermore, the embodiment allows a hanging column approach by providing a suspension center close to or above the center of gravity of the column of a particle beam apparatus.

The cross section of said at least one of said hollow bodies may vary in said first direction. Furthermore, said at least one of said hollow bodies may have a first and a second outer surface being in contact to each other and forming an edge, and wherein a cross section through said edge having the form of the letter "L".

According to the present invention, said cross section of said at least one of said hollow bodies may have curved boundaries. Moreover, the base structure may have a hollow base element and at least two arms extending from said base element.

The arms of the base structure may each comprise an end arranged opposite to the base element. The distance between the arms diminishes from the ends of the arms in the direction of the base element. For reasons of access, the arms and the base element may form substantially a U-shape or a V-shape.

The base element may comprise a front wall, a back wall and a side wall which together form the hollow body of the base element. The arms may extend from the front wall of the base element.

At least one of the arms of the base structure according to the invention may be formed as a hollow body. One embodiment of the invention comprises the at least one arm having surfaces which form the hollow body which may comprise a front wall, a back wall and at least one side wall. The front wall, the back wall and the side wall of the arm provide the hollow body of the corresponding arm. The side wall of said at least one arm may be arranged (e.g. mounted) at the base element, especially at the back wall of the base element.

According to the present invention, an embodiment of the base structure may comprise a support element arranged on the base element. The support element may comprise a back wall and at least two side walls. The back wall of the support element may be arranged at the back wall of the base element. Additionally, the back wall of the support element may be integrated with the back wall of said base element.

According to the present invention, one embodiment may comprise one or several side elements arranged at the base element. Each side element may comprise a triangular profile. Moreover, each side element may be formed at least partially of a side wall of the support element.

In one embodiment, the side walls of the support element or of the side elements may be preferably connected with each other in a connecting area. The connecting area may comprise a link element. The side walls may be connected with each other via the link element in said connecting area. A bracket may be arranged at the connecting area and extends in a curve along the side walls from the connecting area to said arms.

Another embodiment of the invention may comprise at least three bedding devices for bedding a supporting structure. The bedding devices may be damping elements which are preferably pneumatic.

The arrangement, in particular the base structure may also comprise at least three footings. Preferably, there may be four footings provided. One of these footings may be mounted force loaded, preferably spring mounted.

According to the present invention, an embodiment of the base structure may have a lowest eigenfrequency of greater than or equal to 40 Hz. One embodiment of the invention may comprise a base structure having a lowest eigenfrequency of greater than or equal to 70 Hz, and may be preferably greater than or equal to 80 Hz.

The base element may comprise a box-like structure with a top wall and a bottom wall, wherein said top wall is inclined with respect to said bottom wall. The support element and/or a side element may also be formed at least partially as a closed profile.

According to the invention, an embodiment may include at least one of said hollow bodies comprises surfaces with at least one opening. For example, the closed profile of the support element may comprise a surface, whereby at least 30% of the surface comprises at least one opening which is used to access the particle beam apparatus for operating, service or mounting purposes.

The arrangement according to the invention may be at least partially casted or a welded steel construction.

According to the present invention, an embodiment of the base structure may also comprise a supporting structure for holding a particle beam apparatus. The supporting structure may be formed at least partially as a space truss and may comprise a mounting device, e.g. a mounting ring, for mounting a particle beam apparatus, in particular a TEM. An embodiment of the supporting structure may be preferably arranged in the bedding devices mentioned above. It may have a much higher eigenfrequency than the base structure. Preferably, the supporting structure may have an eigenfrequency of greater than or equal to 80 Hz, preferably 120 Hz or preferably 140 Hz.

In accordance with another aspect of the present invention, a particle beam apparatus comprising a particle optical column including a particle source and particle optical components, a base structure comprising a plurality of hollow bodies, said particle optical column being suspended on said base structure. At least one of said hollow bodies has a first length extension in a first direction, a second length extension in a second direction and a third length extension in a third direction, said length extension in said first direction being larger than said length extensions in said second and third directions, and wherein a cross section of said at least one of said hollow bodies perpendicular to said first direction is substantially triangular.

In accordance with another aspect of the present invention is a particle beam apparatus comprising a particle optical column including a particle source and particle optical components and a base structure comprising a plurality of hollow bodies. The particle optical column has a centre of gravity and is suspended on said base structure with a suspension center near or above said center of gravity of the particle optical column.

In accordance with yet another aspect of the present invention is an arrangement for holding a particle beam apparatus, in particular a transmission electron microscope, comprising a base structure. The base structure has four footings, wherein one of said footings being moveable with respect to said base structure, and wherein a movement of said one of said footings is force loaded.

The movable footing may comprise a brake by which a movement of the footing with respect to the base structure can be blocked.

The footings may be arranged at the base structure at attachment regions. The base structure has values of stiffness in the attachment regions. The at least one of the footings which is moveable with respect to said base structure may be attached to said base structure at one of said attachment regions in which said base structure has the lowest value of stiffness.

In accordance with another aspect of the invention is a particle beam apparatus holding arrangement for holding a particle beam apparatus, in particular a TEM, comprising an arrangement, in particular a base structure, having at least one of the features mentioned above.

BRIEF DESCRIPTION OF THE DRAWINGS

Features and advantages of the present invention will become more apparent from the following detailed description of exemplary embodiments thereof taken in conjunction with the accompanying drawings in which.

DETAILED DESCRIPTION OF THE PREFERRED EMBODIMENTS

The invention as now described refers to an arrangement for holding a TEM by way of example only. It should be noted that the invention also refers to any other arrangement for holding devices, particularly particle beam apparatus.

Figure 1:
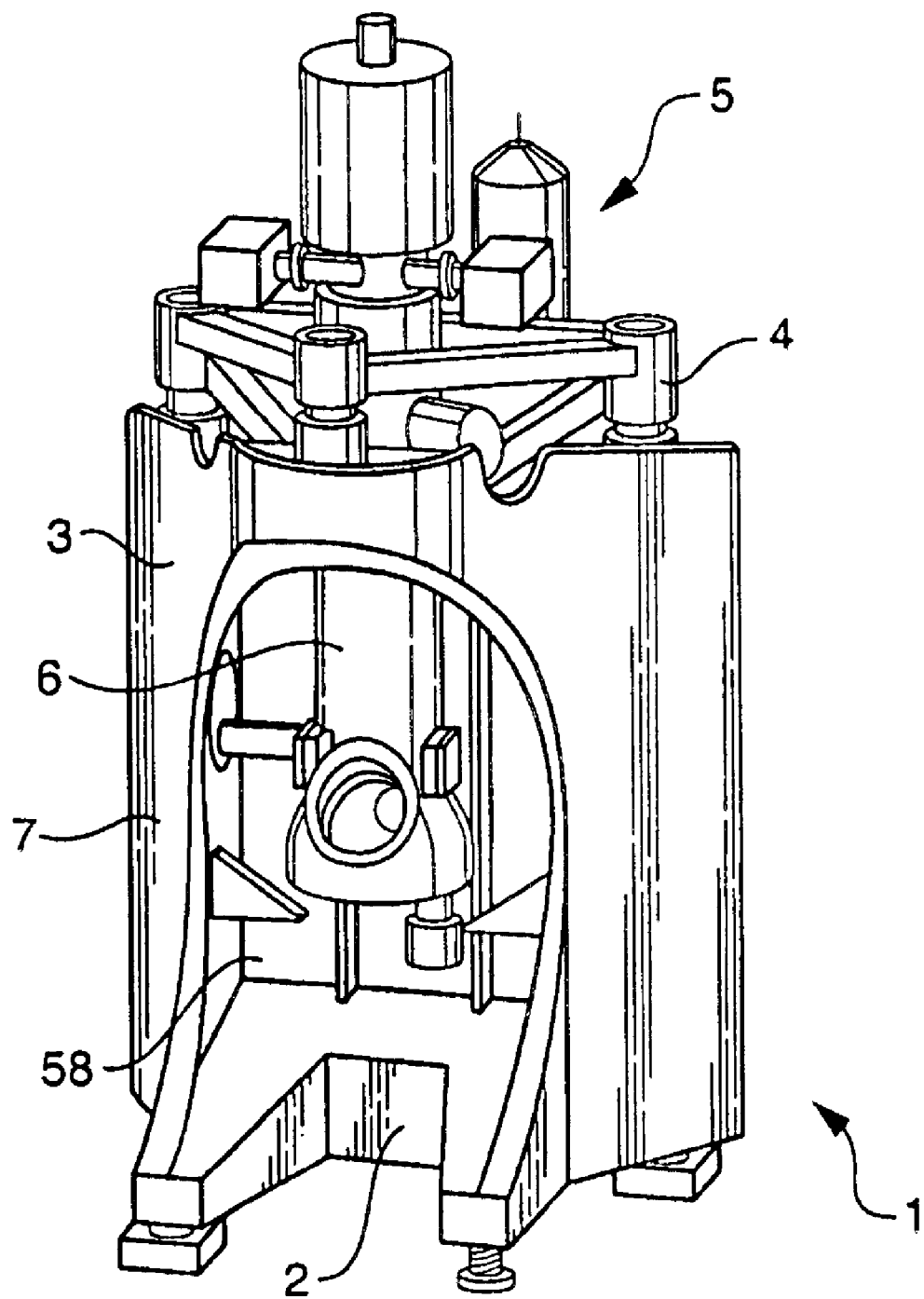
FIG. 1 is a schematic view of a first embodiment of an arrangement for holding a transmission electron microscope according to the present invention with a TEM mounted in the arrangement.

Referring to FIG. 1, shown is a first embodiment of an arrangement 1 for holding a TEM 5 comprises a base structure 7 with a base element 2 and a support element 3. The arrangement further comprises a supporting structure 4.

The TEM 5 is mounted in the supporting structure 4 and comprises a column 6 which is suspended freely on the supporting structure 4 into an interior space which is surrounded at least partially by the support element 3. This construction of the base structure 7 will now be explained in more detail by reference to FIGS. 2 to 4. The grey lines shown in FIG. 4 are hidden lines.

Figure 2:
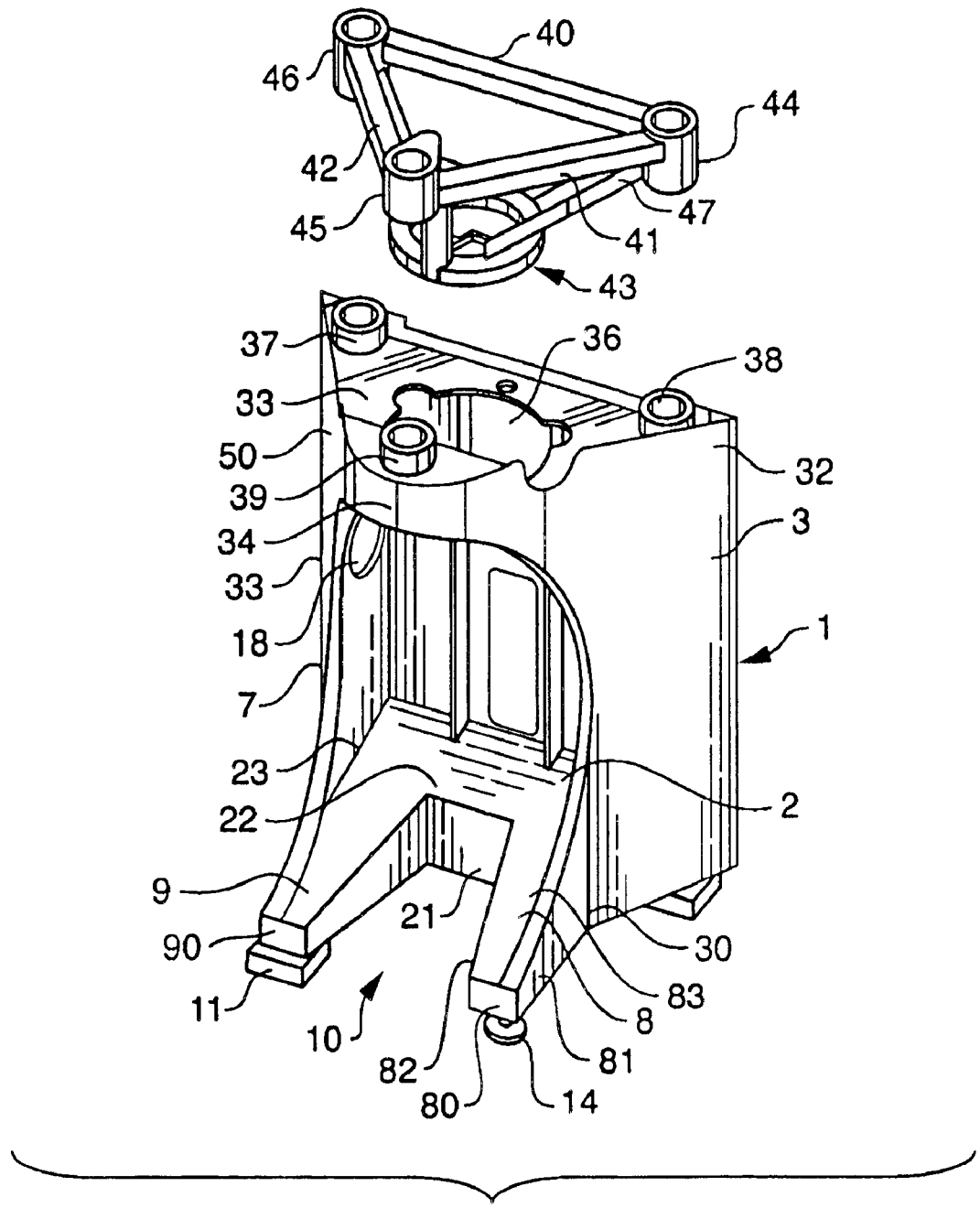
FIG. 2 is a schematic view of the arrangement of FIG. 1, seen inclined from the front side.
Figure 3:
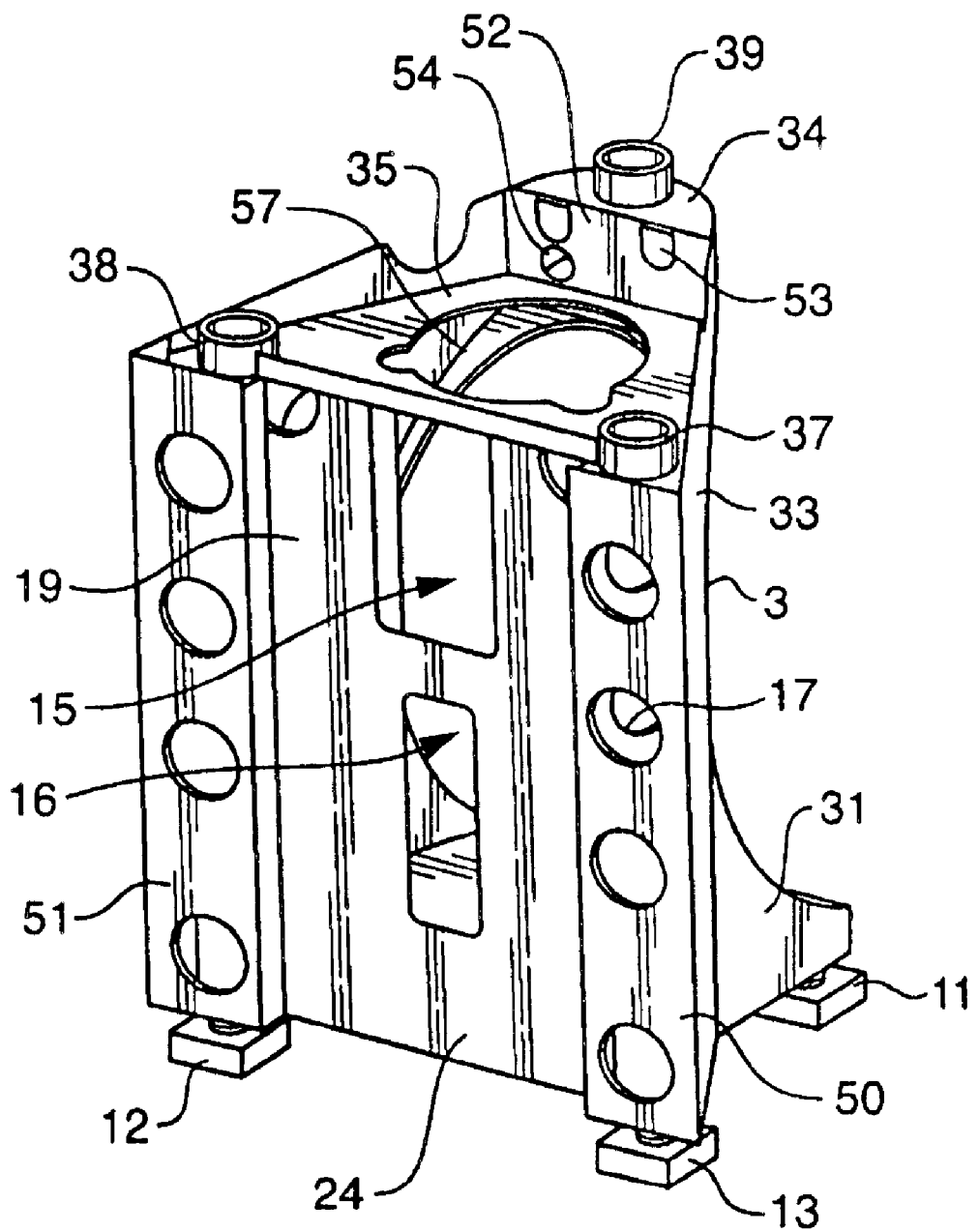
FIG. 3 is a schematic view of the base structure of the arrangement of FIG. 1, seen inclined from the back side.
Figure 4:
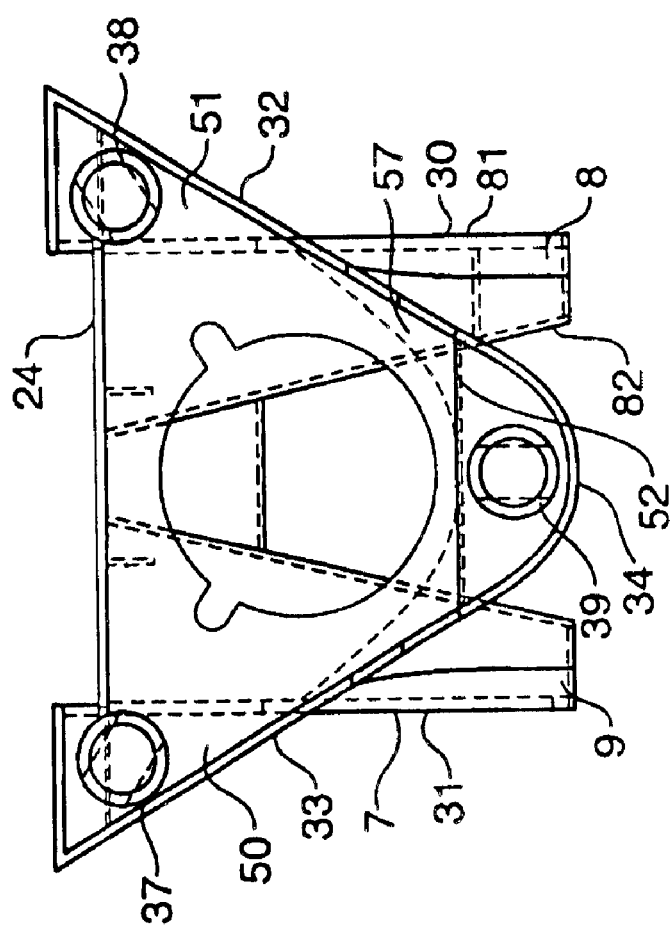
FIG. 4 is a schematic top view of the base structure of the arrangement of FIG. 1

FIGS. 2 and 3 are schematic views from the front and back of the arrangement 1, respectively. The TEM 5 is not shown in FIGS. 2 and 3 for reasons of clarity.

As mentioned above, the base structure 7 comprises the support element 3 and the base element 2. The base element 2 has a hollow body formed by a front wall 21, a back wall 24, a top wall 22, side walls and a bottom wall, which is not shown in the Figures. In FIG. 2 only side walls 22 and 23 are provided with reference numbers for reasons of clarity. The side wall 23 of the base element 2 is formed by a side wall of a side element 50 which is arranged at the side of the base element 2. The side wall of the base element 2 opposite to the side wall 23 is constructed accordingly.

In front of the base element 2, arms 8 and 9 are arranged extending from the base element 2. The arms 8 and 9 also have a hollow body formed by side walls, a front wall, a bottom wall, a top wall and a back wall. For the arm 8, this is now explained in more detail and is shown in FIG. 2 to 4. The arm 8 comprises a front wall 80 as well as side walls 81 to 83. It also comprises a side wall which is a bottom wall (not shown) and a side wall which is a top wall. The front wall 80 forms an end arranged opposite to the base element 2. The sidewall 82 projects into the base element 2 and is mounted at the back wall 24 of the base element 2. The side wall 81 of the arm 8 is formed by the side wall 30 of the support element 3. The construction of arm 9 is substantially identical with the construction of arm 8. Only differences relating to symmetry are given.

There is a space 10 between the arms 8 and 9 which extends from the ends 80 and 90 of the arms 8 and 9 to the front wall 21 of the base element 2. The distance between the arms 8 and 9 decreases from the ends 80 and 90 in the direction of the front wall 21 of the base element 2. The arms 8 and 9 substantially form, together with the base element 2, a U-like structure.

The base element 2 as well as the arms 8 and 9 have footings 11 to 14. The footings 1 1 and 14 are arranged in the area of the ends 80 and 90 of the arms 8 and 9. The footings provide contact with a building's floor on which the arrangement 1 is placed.

As mentioned above, the base structure 7 comprises four footings 11 to 14. Due to the four footings 11 to 14, the base structure 7 is statically over defined. However, this provides a large footprint for the base structure 7 and the space 10, which enables the access of the operator to the TEM. For providing load compensation, the footing 14 is spring mounted, resulting in a statically well defined situation for the remaining three footings 11 to 13. The additional force transferred by the footing 14 is determined by the spring characteristics and the compression of the spring. After the mounting of the arrangement 1 and the TEM 5, the position of the spring mounted footing 14 is blocked by a brake. The load distribution between the four footings is represented by the deformation of the base structure 7 under the load of itself and of the TEM 5. This deformation does not change during the blockage of the spring mounted footing 14. Thus the load distribution remains constant. The blockage is realised in a very stiff way, e.g. by clamping. Taking the stiffness of the ground into account, the lowest eigenfrequency of the base structure is strongly improved due to the stiff connection to the ground by all four footings. In the embodiment of FIG. 1 to 4 wedge shoes are used for the footings 11 to 13 as adjustable footings with very high stiffness. Every footing uses a calotte (not shown) in order to enable a stiff connection to the ground. The operation of the spring might be adjustable. Alternatively, the spring characteristics may be calculated and chosen regarding the specific requirements given by the load distribution and the desired tolerance range for the mounting. By the same technique it is also possible to reach a large footprint and a statically well defined situation with a stiff connection to the ground with five or more footings.

Referring again to FIG. 2 to 4, the support element 3 will now be described in more detail. The support element 3 is arranged substantially above the base element 2 and the arms 8 and 9. The support element 3 comprises side walls 30 and 31 turning to side walls 32 and 33 of the support element 3, respectively. The side walls 30, 32 as well as the side walls 31, 33 are integrated. Alternatively, they are formed by separate wall pieces connected to each other, for example by a bolt connection. The side walls 30 to 33 comprise side surfaces extending in a curve substantially from the ends 80 and 90 of the arms 8 and 9 to a connecting area 34, where side walls 32 and 33 are adjacent to each other and are integrated with each other.

The support element 3 also comprises an upper side 35 having an opening 36. The column 6 of the TEM 5 (not shown in FIG. 2 to 4) projects into the interior space through that opening 36. The upper side 35 has substantially a triangular shape comprising corner areas on which bedding devices 37 to 39 are arranged for bedding the supporting structure 4. The bedding devices 37 to 39 comprise pneumatic damping elements and are used for the hanging suspension of the TEM 5 in the base structure 7.

In the connecting area 34, a link element 52 is arranged between the side walls 32 and 33. The link element 52 has the form of a shoulder. A bedding device 39 is arranged on the link element 52. The link element 52 is used for stiffening the connecting area 34. Moreover, the link element 52 comprises openings 53 and 54 for purposes of reducing weight and for easy access for mounting and service purposes.

Furthermore, a bracket 57 is provided. The bracket 57 extends in a curve from the connecting area 34 in the direction of the arms 8 and 9. The bracket enhances the stiffness of the base structure 7, especially to avoid pitching of the base structure 7 in the connecting area 34.

The support element 3 also comprises a back wall 19 integrated with the back wall 24 of the base element 2. The back wall 19 has openings 15 and which are used substantially for an easy access to the TEM 5, for example for access to the column 6 of the TEM 5 or to a vacuum system associated with the TEM 5.

As mentioned above, side elements 50 and 51 are arranged at the side of the base element 2 in the back area of the base structure 7. The side elements 50 and 51 have substantially triangular shapes (as seen in FIG. 4). The side walls of the side elements are formed partially from the side walls and 32 as well as the side walls 23 which are at least partially side walls of the base element 2 as mentioned above. The bedding devices 37 and 38 are arranged in the upper area of the side elements 50 and 51. Moreover, the side walls of the side elements 50 and 51 comprise openings 17 and 18, which, on the one hand, have the effect of reducing the weight of the base structure 7. On the other hand, the openings 17 and 18 are used for easy access to the base structure 7 and the TEM 5 for mounting and service purposes.

As mentioned above, the sidewalls 30 to 33 and the bracket 57 comprise a surface extending in a curve from the ends 80 and 90 of the arms and 9 to the connecting area 34. These sidewalls 30 to 33, together with the space 10, form an access opening 58 (shown in FIG. 1) which gives easy access to the column 6 of the TEM 5, in particular to the viewing glass arranged at the lower part of the column 6 (see also FIG. 1).

Referring again to FIGS. 2 and 3, the supporting structure 4 is described in more detail. The supporting structure 4 is formed as a stiff profile framework. It also comprises a substantially triangular shape formed substantially by the arrangement of three connecting elements 40 to 42. Bedding devices 44 to 46 are arranged in the corner areas of the supporting structure 4, which operate together with the support element 3's bedding devices 37 to 39. Furthermore, the supporting structure 4 comprises a mounting ring 43 connected to the connecting elements 40 to 42 by a rigid frame system 47. The column 6 of the TEM 5 is fixed on the mounting ring 43 by connecting means (not shown in FIG. 2).

Each of the above mentioned walls may have a thickness of about 5 to 20 mm. (0. 197 inch to 0.787 inch). Due to the hollow body shape and the substantially triangular shape of most components of the base structure 7, a very stiff structure is provided with a very good eigenfrequency. It has been found that the complete base structure 7—including, as far as present, the base element 2, the support element 3, the arms 8 and 9, the side elements 50 and 51 and the link element—has a eigenfrequency preferably above 80 Hz. The eigenfrequency of the supporting structure 4 is preferably above 140 Hz. The eigenfrequencies of above-mentioned damping elements is below 3 Hz, preferably in the area of 1.8 Hz or lower in the lateral as well as in the vertical direction. The eigenfrequency of the column 6 of the TEM 5 is in the area of over 100 Hz.

With this arrangement, one can expect minimized excitation of the eigenmodes of the column 6 which is obtained by optimized isolation of the column 6 from floor vibrations. The base structure 7 provides bearing points (bedding devices) which are at least 1.2 m (47.25 inches) above floor level and preferably 1.8 m (70.87 inches) or more above floor level. Therefore, an arrangement is provided which is sufficient for receiving a good resolution in the area of 1 Å or less, since an optimized isolation of the vibrations is provided.

The above described embodiment of the invention has hollow bodies with outer surfaces, having holes therein. The ratio between the surfaces of the holes and the surfaces of material can be strongly enlarged as long as the edges of the hollow bodies remain from material with fringes of the adjacent surfaces also from material. In the marginal case the complete arrangement can be in the form of a space truss. Also in this marginal case the trusses of the space truss form edges of hollow bodies which substantially define the stiffness of the arrangement, therefore this marginal case has to be regarded as to comprise hollow bodies in the meaning of the invention.

Figure 5B:
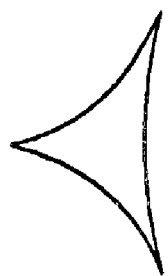
FIG. 5 is a schematic view of the cross section of a hollowed body of a base structure.
Figure 5A:

FIG. 5 shows alternative embodiments of the cross section of the components of the base structure 7, the components having the above mentioned hollow body structure. These embodiments show that the components (hollow bodies) have at least one curved boundary. FIG. 5 shows cross sections of components with all boundaries curved. In particular, FIG. 5A shows boundaries curved to the outside of the component and FIG 5b shows boundaries curved to the inside of the component.

While the invention has been disclosed in connection with the preferred embodiments shown and described in detail, various modifications and improvements thereon will become readily apparent to those skilled in the art. Accordingly, the spirit and scope of the present invention is to be limited only by the following claims.

What is claimed is:

1. An arrangement for holding a particle beam apparatus, in particular a transmission electron microscope, comprising:
   a base structure comprising a plurality of hollow bodies, at least one of said hollow bodies having a first length extension in a first direction, a second length extension in a second direction and a third length extension in a third direction, said length extension in said first direction being larger than said length extensions in said second and third directions, and
   wherein a cross section of said at least one of said hollow bodies perpendicular to said first direction is substantially triangular.

2. The arrangement of claim 1, wherein said cross section of said at least one of said hollow bodies varies in said first direction.

3. The arrangement of claim 1, wherein said at least one of said hollow bodies has a first and a second outer surface being in contact to each other and forming an edge, and wherein a cross section through said edge having the form of the letter "L".

4. The arrangement of claim 1, wherein said cross section of said at least one of said hollow bodies has curved boundaries.

5. The arrangement of claim 1, wherein said base structure has a hollow base element and at least two arms extending from said base element.

6. The arrangement according to claim 5, wherein each of said arms comprises an end on a side opposite to said base element and wherein a distance between said arms diminishes from said ends of said arms in the direction of said base element.

7. The arrangement according to claim 6, wherein said arms and said base element form substantially a U-shape.

8. The arrangement according to claim 6, wherein said arms and said base element form substantially a V-shape.

9. The arrangement according to claim 5, wherein said base element comprises a front wall, a back wall and a side wall, said front wall, said back wall and said side wall forming said hollow base element, and wherein said arms extend from said front wall of said base element.

10. The arrangement according to claim 5, wherein at least one of said arms is formed as a hollow body.

11. The arrangement according to claim 10, wherein said at least one arm comprises surfaces which form said hollow body, wherein said surfaces may comprise a front wall, a back wall and at least one side wall, and wherein said front wall, said back wall and said at least one side wall of said at least one arm form said hollow body.

12. The arrangement according to claim 11, wherein said side wall of said at least one arm is arranged at said base element.

13. The arrangement according to claim 12, wherein said side wall of said at least one arm is arranged at said back wall of said base element.

14. The arrangement according to claim 5, said base structure further comprising a support element arranged on said base element, wherein said support element comprises a back wall and at least two side walls, and wherein said back wall of said support element is arranged on said back wall of said base element.

15. The arrangement according to claim 14, wherein said back wall of said support element and said back wall of said base element are integrated.

16. The arrangement according to claim 14, wherein said side walls of said support element form substantially a U-shape.

17. The arrangement according to claim 14, wherein said side walls of said support element are integrated.

18. The arrangement according to claim 14, wherein said base structure further comprises side elements with side walls and a connecting area in which a link element is arranged, and wherein said side walls of the support element or said side walls of the side elements are connected with each other via said link element in said connecting area.

19. The arrangement according to claim 18, wherein a bracket is arranged at said connecting area, said bracket extending in a curve along the side walls from said connecting area to said arms.

20. The arrangement according to claim 5, wherein a side element is arranged at said base element.

21. The arrangement according to claim 20, wherein said side element comprises a triangular profile.

22. The arrangement according to claim 20, wherein said side element is formed at least partially of said side wall of said support element.

23. An arrangement for holding a particle beam apparatus, in particular a transmission electron microscope, comprising:
- a base structure comprising a plurality of hollow bodies, at least one of said hollow bodies having a first length extension in a first direction, a second length extension in a second direction and a third length extension in a third direction, said length extension in said first direction being larger than said length extensions in said second and third directions, wherein a cross section of said at least one of said hollow bodies perpendicular to said first direction is substantially triangular, and wherein said base structure has a hollow base element and at least two arms extending from said base element; and
- at least three bedding devices for bedding a supporting structure.

24. The arrangement according to claim 23, wherein said bedding devices are damping elements.

25. The arrangement according to claim 24, wherein said damping elements are pneumatic.

26. The arrangement according to claim 1, further comprising at least three footings.

27. The arrangement according to claim 26, wherein said arrangement comprises four footings, one of said footings being mounted force loaded.

28. The arrangement according to claim 1, wherein said base structure has a lowest eigenfrequency of greater than or equal to 40 Hz.

29. The arrangement according to claim 1, wherein said base structure has a lowest eigenfrequency of greater than or equal to 70 Hz.

30. The arrangement according to claim 1, wherein said base structure has a lowest eigenfrequency of greater than or equal to 80 Hz.

31. The arrangement according to claim 5, wherein said base element comprises a box-like structure with a top wall and a bottom wall, wherein said top wall is inclined with respect to said bottom wall.

32. The arrangement according to claim 14, wherein said support element comprises at least partially a closed profile.

33. The arrangement according to claim 20, wherein said side element comprises at least partially a closed profile.

34. The arrangement according to claim 1, wherein at least one of said hollow bodies comprises surfaces with at least one opening.

35. The arrangement according to claim 1, wherein said arrangement is at least partially casted.

36. The arrangement according to claim 1, wherein said arrangement is at least partially a welded construction.

37. The arrangement according to claim 23, further comprising a supporting structure for holding a particle beam apparatus which is arranged on said bedding devices.

38. The arrangement according to claim 37, said arrangement having a base structure having an eigenfrequency, and wherein said supporting structure has an eigenfrequency greater than or equal to said eigenfrequency of said base structure.

39. The arrangement according to claim 38, wherein said supporting structure has a lowest eigenfrequency of greater than or equal to 80 Hz.

40. The arrangement according to claim 38, wherein said supporting structure has a lowest eigenfrequency of greater than or equal to 120 Hz.

41. The arrangement according to claim 38, wherein said supporting structure has a lowest eigenfrequency of greater than or equal to 140 Hz.

42. A particle beam apparatus comprising:
- a particle optical column including a particle source and particle optical components;
- a base structure comprising a plurality of hollow bodies, said particle optical column being suspended on said base structure,
- at least one of said hollow bodies having a first length extension in a first direction, a second length extension in a second direction and a third length extension in a third direction, said length extension in said first direction being larger than said length extensions in said second and third directions; and
- wherein a cross section of said at least one of said hollow bodies perpendicular to said first direction is substantially triangular.

43. A particle beam apparatus, comprising:
- a particle optical column including a particle source and particle optical components;
- a base structure comprising a plurality of hollow bodies, wherein at least one of said plurality of hollow bodies has a first length extension in a first direction, a second length extension in a second direction and a third length extension in a third direction, said first length extension being larger than said second and third length extensions, wherein a cross section of said least one of said plurality of hollow bodies perpendicular to said first direction is substantially triangular,
- and wherein said particle optical column has a center of gravity, and said particle optical column is suspended on said base structure with a suspension center near or above said center of gravity of said particle optical column.

44. An arrangement for holding a particle beam apparatus, in particular a transmission electron microscope, comprising:
- a base structure,
- said base structure having four footings, wherein one of said footings being moveable with respect to said base structure, and wherein a movement of said one of said footings is force loaded, and wherein said one of said footings comprises a brake by which a movement of said one of said footings with respect to said base structure can be blocked.

45. The arrangement of claim 44, wherein said footings are arranged at said base structure at attachment regions, said base structure having values of stiffness in said attachment regions, and said at least one of said footings being moveable with respect to said base structure, being attached to said base structure at one of said attachment regions in which said base structure has the lowest value of stiffness.

46. A particle beam apparatus, comprising:
- a particle optical column including a particle source and particle optical components; and
- a base structure comprising a plurality of hollow bodies, wherein said particle column has a center of gravity, and said particle optical column is suspended on said base structure with a suspension center substantially above said center of gravity of said particle optical column.

47. A particle beam apparatus holding arrangement for holding a particle beam apparatus, in particular a transmission electron microscope, comprising an arrangement according to one of the claims 1 to 44, 45, and 46.

* * * * *